United States Patent [19]
Yamada et al.

[11] Patent Number: 6,127,016
[45] Date of Patent: Oct. 3, 2000

[54] SPUTTERING TARGET, METHOD OF PRODUCING THE TARGET, OPTICAL RECORDING MEDIUM FABRICATED BY USING THE SPUTTERING TARGET, AND METHOD OF FABRICATING THE OPTICAL RECORDING MEDIUM

[75] Inventors: Katsuyuki Yamada, Mishima; Hiroko Iwasaki, Tokyo; Yukio Ide, Mishima; Makoto Harigaya, Hiratsuka; Yoshiyuki Kageyama, Yokohama; Hiroshi Deguchi, Yokohama; Masaetsu Takahashi, Yokohama; Yoshitaka Hayashi, Machida, all of Japan

[73] Assignee: Ricoh Company, Ltd., Tokyo, Japan

[21] Appl. No.: 08/943,601

[22] Filed: Oct. 3, 1997

Related U.S. Application Data

[62] Division of application No. 08/571,087, Dec. 12, 1995, Pat. No. 5,785,828.

[30] Foreign Application Priority Data

Dec. 13, 1994 [JP] Japan ..................................... 6-332532

[51] Int. Cl.⁷ ........................................................ B32B 3/00
[52] U.S. Cl. ........................ 428/64.1; 428/64.2; 428/64.4; 428/64.5; 428/913; 430/270.13; 430/495.1; 430/945; 369/283; 369/288
[58] Field of Search ................................... 428/64.1, 64.2, 428/64.4, 64.5, 64.7, 913; 430/270.13, 495.1, 945; 369/283, 288

[56] References Cited

U.S. PATENT DOCUMENTS

| | | |
|---|---|---|
| 5,011,723 | 4/1991 | Harigaya et al. . |
| 5,024,927 | 6/1991 | Yamada et al. . |
| 5,080,947 | 1/1992 | Yamada et al. . |
| 5,100,700 | 3/1992 | Ide et al. . |
| 5,156,693 | 10/1992 | Ide et al. . |

FOREIGN PATENT DOCUMENTS

| | | |
|---|---|---|
| 0574025 | 12/1993 | European Pat. Off. . |
| 3-162570 | 7/1991 | Japan ................................ 204/298.13 |

OTHER PUBLICATIONS

Patent Abstracts of Japan. vol. 018 No. 496 (M–1674, Sep. 16, 1994 & JP–A–06 166268 (RICOH CO. LTD) Jun. 14, 1994 *abstract*.

Database WPI Section Ch. Week 8632 Derwent Publications Ltd., London, GB; Class M13, AN 86–207922. & JP–A–61 139 637 (Hitachi Metal KK), Jun. 26, 1986 *abstract*.

*Primary Examiner*—Elizabeth Evans
*Attorney, Agent, or Firm*—Cooper & Dunham LLP

[57] ABSTRACT

A sputtering target for fabricating a recording layer of a phase-change type optical recording medium contains a compound or mixture including as constituent elemets Ag, In, Te and Sb with the respective atomic percent (atom. %) of $\alpha$, $\beta$, $\gamma$ and $\delta$ thereof being in the relationship of $2 \leq \alpha \leq 30$, $3 \leq \beta \leq 30$, $10 \leq \gamma \leq 50$, $15 \leq \delta \leq 83$ and $\alpha+\beta+\gamma+\delta=100$, and a method of producing the above sputtering target is provided. A phase-change type optical recording medium includes a recording layer containing as constituent elements Ag, In, Te and Sb with the respective atomic percent of $\alpha$, $\beta$, $\gamma$ and $\delta$ thereof being in the relationship of $0<\alpha \leq 30$, $0<\beta \leq 30$, $10 \leq \gamma \leq 50$, $10 \leq \delta \leq 80$, and $\alpha+\beta+\gamma+\delta=100$, and is capable of recording and erasing information by utilizing the phase changes of a recording material in the recording layer. A method of fabricating the above phase-change type optical recording medium is also provided.

16 Claims, 8 Drawing Sheets

FIG. 1
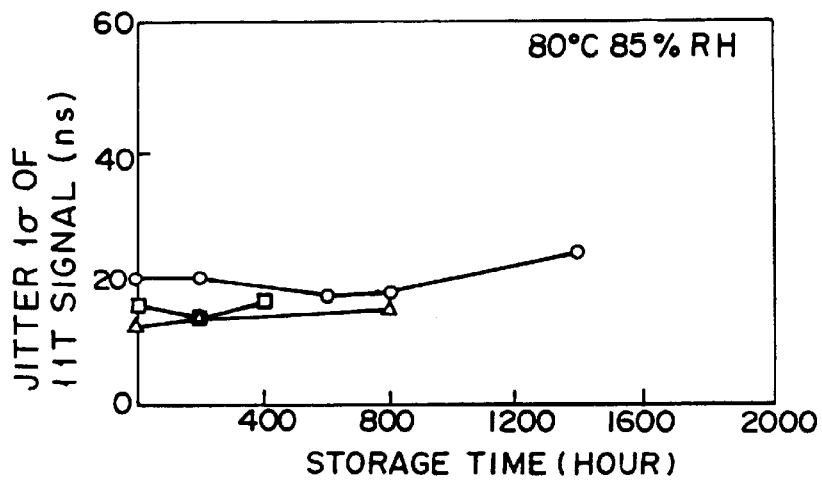
(a)
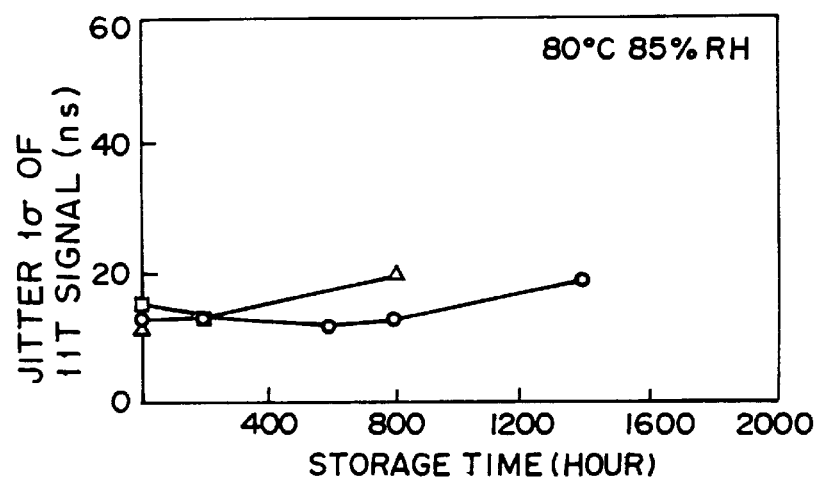
(b)
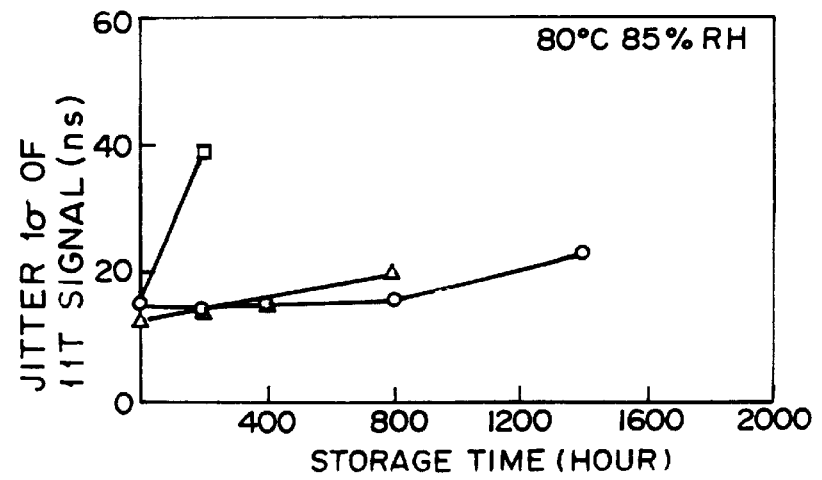
(c)

FIG. 3
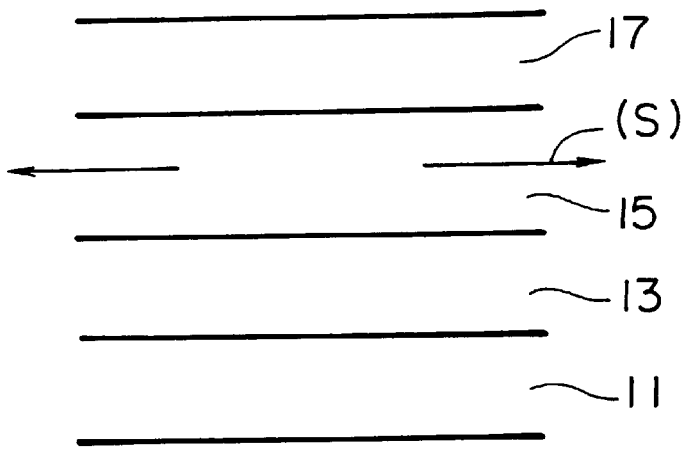
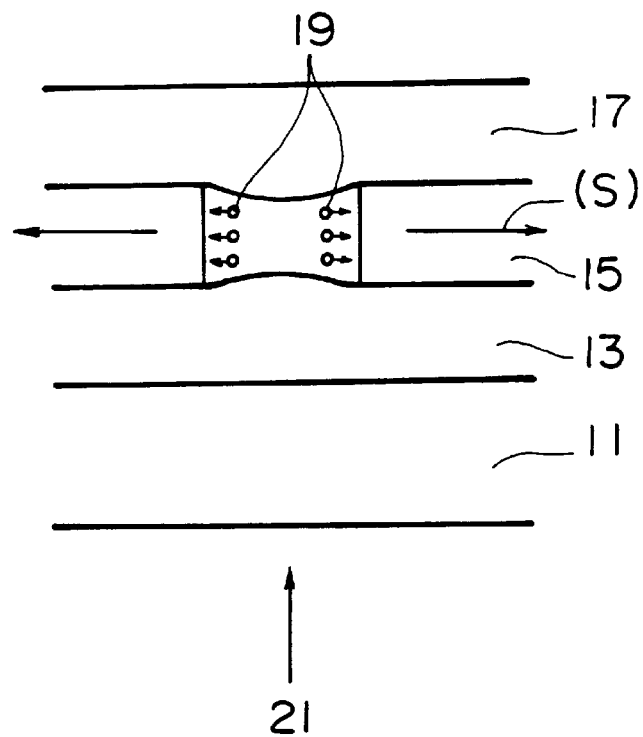

SPUTTERING TARGET, METHOD OF PRODUCING THE TARGET, OPTICAL RECORDING MEDIUM FABRICATED BY USING THE SPUTTERING TARGET, AND METHOD OF FABRICATING THE OPTICAL RECORDING MEDIUM

This is a division of application Ser. No. 571,087, filed Dec. 12, 1995 now U.S. Pat. No. 5,785,828 issued Jul. 28, 1998.

BACKGROUND OF THE INVENTION

1. Field of the Invention

The present invention relates to a sputtering target for fabricating a recording layer of an optical recording medium; a method of producing the sputtering target; a phase-change type optical recording medium comprising a recording material in a recording layer thereof, which recording material is capable of causing changes in the phase thereof by the application of a laser beam thereto, thereby recording, reproducing and overwriting information therein; and a method of fabricating the above-mentioned phase-change type optical recording medium by using the above-mentioned sputtering target.

2. Discussion of Background

There is conventionally known a phase-change type optical information recording medium which utilizes phase changes between a crystalline phase and an amorphous phase or between one crystalline phase and another crystalline phase as one of the optical recording media which are capable of recording, reproducing and erasing information by the application thereto of electromagnetic waves, such as a laser beam. This kind of phase-change type optical information recording medium enables the overwriting of information by the application of a single laser beam thereto, although such overwriting is difficult to conduct by the application of a single laser beam in magneto-optical memory using a magneto-optical recording medium. An optical system of a drive unit for the phase-change type optical information recording medium can be designed simpler than that for a magneto-optical recording medium, so that recently research and development of this kind of recording medium has been actively conducted.

As disclosed in U.S. Pat. No. 3,530,441, the so-called chalcogen-based alloys, such as Ge—Te, Ge—Te—Se, Ge—Te—S, Ge—Se—S, Ge—Se—Sb, Ge—As—Se, In—Te, Se—Te and Se—As, are conventionally used as recording materials for the phase-change type optical recording medium. In addition, it is proposed to add an element of Au to the above-mentioned Ge—Te based alloy to improve the stability and to increase the rate of crystallization of the recording material as disclosed in Japanese Laid-Open Patent Application 61-219692. Furthermore, the addition of Sn and Au to the Ge—Te based alloy, and the addition of Pd to the same are respectively proposed in Japanese Laid-Open Patent Applications 61-270190 and 62-19490 for the same purposes as mentioned above. Furthermore, recording materials comprising a mixture of Ge, Te, Se and Sb, and a mixture of Ge, Te and Sb are respectively disclosed in Japanese Laid-Open Patent Applications 62-73438 and 63-228433, each of which has a specific composition in terms of atomic percent of each constituent element of the recording material for the improvement of the recording and erasing repetition properties of the obtained recording medium.

However, none of the above-mentioned conventional phase-change type optical recording media satisfies all the requirements for the phase-change type rewritable optical recording medium. In particular, most important points to be improved in the conventional phase-change type optical recording media are to improve the recording sensitivity and erasing sensitivity, and to prevent the decrease of the erasability in the course of the overwriting operation, which is caused by the portions remaining unerased.

For the above-mentioned improvements, a mixed-phase type recording material comprising as constituent elements Ag, In, Sb and Te is proposed, as disclosed in Japanese Laid-Open Patent Applications 3-240590, 4-78031, 4-232779 and 5-345478. Such a mixed-phase type recording material can show the recording and erasing sensitivities to the light with a peak power of 12 mW or lees, and excellent erasabillty, so that it is effective when used in a recording layer for mark edge recording. However, conventional optical recording media employing the Ag—In—Sb—Te based recording materials are still insufficient with respect to the shelf stability and the repetition reliability.

SUMMARY OF THE INVENTION

Accordingly, a first object of the present invention is to provide a sputtering target for fabricating a recording layer of an optical recording medium with excellent C/N ratio, high erasability and sensitivities, minimum jitter, and sufficient shelf stability and repetition reliability.

A second object of the present invention is to provide a method of producing the above-mentioned sputtering target.

A third object of the present invention is to provide an optical recording medium with excellent C/N ratio, high erasability and sensitivities, minimum jitter, and sufficient shelf stability and repetition reliability.

A fourth object of the present invention is to provide a method of producing the above-mentioned optical recording medium.

The first object of the present invention can be achieved by a sputtering target for fabricating a recording layer of an optical recording medium capable of recording and erasing information by utilizing changes in the phase of a recording material in the recording layer, the sputtering target comprising a compound or mixture comprising as constituent elements Ag, In, Te and Sb with the respective atomic percent (atom. %) of $\alpha$, $\beta$, $\gamma$ and $\delta$ thereof being in the relationship of $2 \leq \alpha \leq 30$, $3 \leq \beta \leq 30$, $10 \leq \gamma \leq 50$, $15 \leq \delta \leq 83$, and $\alpha + \beta + \gamma + \delta = 100$.

It is preferable that the compound or mixture for use in the above-mentioned sputtering target comprise Sb, and $AgInTe_2$ with a stoichiometric composition and/or a nearly stoichiometric composition having a chalcopyrite structure, and it is preferable that the $AgInTe_2$ form crystallites with a particle size of 450 Å or less.

The second object of the present invention can be achieved by a method of producing a target for sputtering, comprising the steps of mixing Ag, In and Te elements to prepare a mixture of Ag, In and Te elements, fusing the mixture of Ag, In and Te elements at 600° C. or more to prepare a fused mixture, rapidly cooling the fused mixture to prepare a solid lump, pulverizing the solid lump to prepare finely-divided particles, mixing the finely-divided particles with Sb to prepare a mixture of the finely-divided particles and Sb, and sintering the mixture of the finely-divided particles and Sb.

Alternatively, the second object of the present invention can also be achieved by a method of producing a target for sputtering, comprising the steps of mixing Ag, In, Te and Sb elements to prepare a mixture of Ag, In, Te and Sb elements, fusing the mixture of Ag, In, Te and Sb elements at 600° C. or more to prepare a fused mixture, and rapidly cooling the fused mixture to prepare a solid lump, pulverizing the solid lump to prepare finely-divided particles, and sintering the finely-divided particles.

In either case, it is preferable that the method of producing the sputtering target further comprise the step of carrying out the heat treatment at a temperature not higher than the melting point of the mixture prior to the sintering step.

The third object of the present invention can be achieved by an optical recording medium comprising a recording layer capable of recording and erasing information by utilizing changes in the phase of a recording material in the recording layer, the recording layer comprising as constituent elements Ag, In, Te and Sb with the respective atomic percent of $\alpha$, $\beta$, $\gamma$ and $\delta$ thereof being in the relationship of $0<\alpha\leq30$, $0<\beta\leq30$, $10\leq\gamma\leq50$, $10\leq\delta\leq80$, and $\alpha+\beta+\gamma+\delta=100$.

The third object can also be achieved by an optical recording medium comprising a recording layer capable of recording and erasing information by utilizing changes in the phase of a recording material in the recording layer, the recording layer comprising as constituent elements Ag, In, Te, Sb, and nitrogen and/or oxygen atom with the respective atomic percent of $\alpha$, $\beta$, $\gamma$, $\delta$ and $\epsilon$ thereof being in the relationship of $0<\alpha\leq30$, $0<\beta\leq30$, $9\leq\gamma\leq50$, $9\leq\delta\leq80$, $0<\epsilon\leq5$, and $\alpha+\beta+\gamma+\delta+\epsilon=100$, wherein $\epsilon$ is the total atomic percent of the nitrogen and/or oxygen atom.

In any case, the atomic percent of $\alpha$ and $\gamma$ in the composition of the above-mentioned recording layer may be in the relationship of $\alpha-\gamma/2\leq-8$.

From the aspect of the structure of the optical recording medium, it is preferable that the above-mentioned optical recording medium comprise a polycarbonate substrate, a first protective layer, the previously mentioned recording layer, a second protective layer, a reflective heat dissipation layer and an ultraviolet curing resin layer, which are overlaid in this order.

Furthermore, in the above-mentioned optical recording medium, it is preferable that the first and second protective layers employ the same material, with the total of the thermal stress and the true stress of each protective layer being at least 150 MPa. Further, it is preferable that the yield stress of the recording layer be at least 200 MPa.

In addition, the previously mentioned recording layer may comprise a nitride and/or oxide comprising at least one of the constituent elements Ag, In, Te and Sb; or a nitrogen atom, and may further comprise an element which is capable of forming an alloy or compound in combination with any of the constituent elements Ag, In, Te and Sb.

The fourth object of the present invention can be achieved by a method of producing an optical recording median comprising a recording layer, comprising the step of forming the recording layer in a sputter chamber by sputtering by use of a sputtering target which comprises a compound or mixture comprising as constituent elements Ag, In, Te and Sb with the respective atomic percent of $\alpha$, $\beta$, $\gamma$ and $\delta$ thereof being in the relationship of $2\leq\alpha\leq30$, $3\leq\beta\leq30$, $10\leq\gamma\leq50$, $15\leq\delta\leq83$, and $\alpha+\beta+\gamma+\delta=100$, in a gas comprising argon gas and nitrogen gas with a concentration of 0 to 15 mol %.

In the above-mentioned method of producing the recording medium, it is preferable that the back pressure be met in the range of $3\times10^{-7}$ to $5\times10^{-6}$ Torr prior to the sputtering process.

Further, it is preferable that a gas containing nitrogen gas with a concentration higher than the concentration of nitrogen in the gas employed during the sputtering process be introduced into the sputter chamber after sputtering process.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 1(a), 1(b) and 1(c) are graphs which respectively show the archival life, the shelf properties, and the overwriting shelf properties of the phase-change type optical recording media according to the present invention comprising an Ag—In—Te—Sb based recording material.

FIGS. 3(a) and 3(b) are schematic cross-sectional views of an optical recording medium, in explanation of the generation of a large tensile stress gradient in the recording layer when a laser beam is applied to record information therein.

DESCRIPTION OF THE PREFERRED EMBODIMENTS

Figure 2:
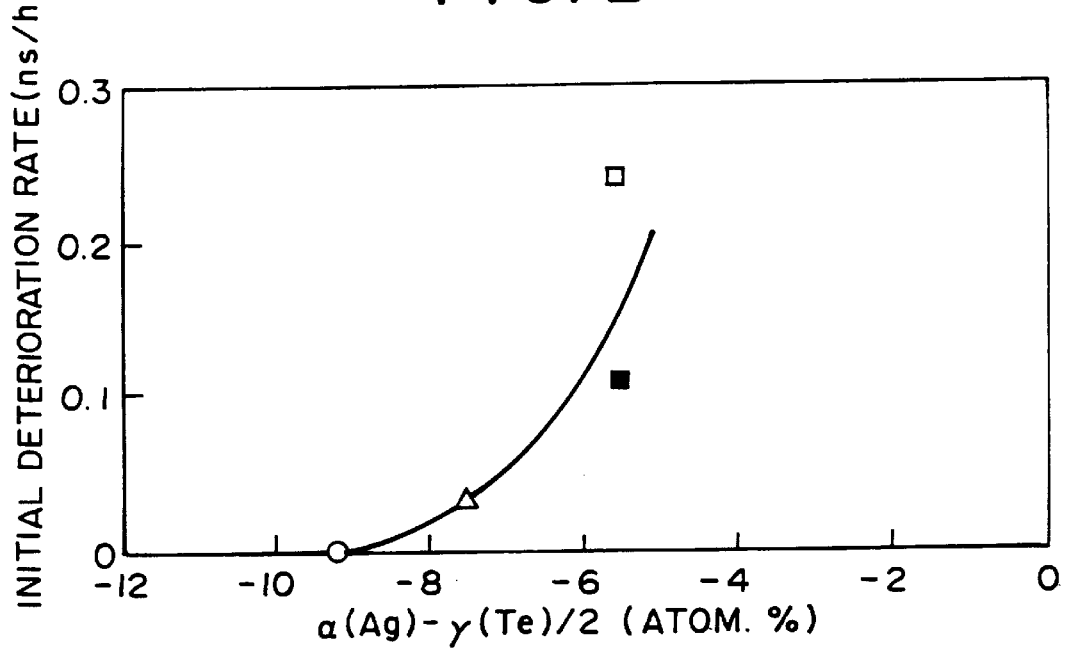
FIG. 2 is a graph which shows the dependence of the initial deterioration rate of the overwriting shelf properties of the optical recording medium according to the present invention on the composition of the recording layer thereof.

In order to obtain an optical recording medium of the present invention, a sputtering target for fabricating a recording layer of the optical recording medium can be employed. The sputtering target according to the present invention comprises a compound or mixture comprising as constituent elements Ag, In, Te and Sb, with the respective atomic percent (atom. %) of $\alpha$, $\beta$, $\gamma$ and $\delta$ thereof being in the relationship of $2\leq\alpha\leq30$, $3\leq\beta\leq30$, $10\leq\gamma\leq50$, $15\leq\delta\leq83$, and $\alpha+\beta+\gamma+\delta=100$.

It is preferable that the above-mentioned compound or mixture for use in the target comprise Sb and $AgInTe_2$ with a stoichiometric composition and/or a nearly stoichiometric composition having a chalcopyrite structure. In addition, it is preferable that the above-mentioned $AgInTe_2$ with a stoichiometric composition and/or a nearly stoichiometric composition having a chalcpyrite structure form crystallites with a particle size (d) of 450 Å or less.

To obtain the above-mentioned target for sputtering, Ag, In and Te elements are mixed to form a mixture, the mixture of Ag, In and Te elements is fused at 600° C. or more, rapidly cooled to prepare a solid lump and pulverized to prepare finely-divided particles. The thus prepared finely-divided particles are mixed with Sb, and the mixture of the finely-divided particles and Sb is sintered. Alternatively, Ag, In, Te and Sb elements are mixed to form a mixture, and the mixture of Ag, In, Te and Sb elements is fused at 600° C. or more, rapidly cooled and pulverized, and then the thus obtained finely-divided particles are sintered.

In any case, it is advantageous to subject the above-mentioned mixture, that is, the mixture of the finely-divided particles of Ag, In and Te elements and Sb, or the mixture of the finely-divided particles of Ag, In, Te and Sb elements, to heat treatment prior to the sintering step. The heat treatment may be carried out at a temperature not higher than the melting point of the mixture, preferably in a rage of 200 to 450° C., more preferably 300 to 400° C., further preferably at around 350° C., that is, the temperature lower than the sintering temperature of the mixture.

The optical recording medium according to the present invention comprises a recording layer capable of recording and erasing information by utilizing changes in the phase of a recording material in the recording layer, the recording layer comprising as constituent elements Ag, In, Te and Sb with the respective atomic percent of $\alpha$, $\beta$, $\gamma$ and $\delta$ thereof being in the relationship of $0<\alpha\leq30$, $0<\beta\leq30$, $10\leq\gamma\leq50$, $10\leq\delta\leq80$, and $\alpha+\beta+\gamma+\delta=100$.

The recording layer of the optical recording medium according to the present invention may comprise as constituent elements Ag, In, Te, Sb and nitrogen and/or oxygen atom, with the respective atomic percent of $\alpha$, $\beta$, $\gamma$, $\delta$ and $\epsilon$ thereof being in the relationship of $0<\alpha\leq30$, $0<\beta\leq30$, $9\leq\gamma\leq50$, $9\leq\delta\leq80$, $0<\epsilon\leq5$, and $\alpha+\beta+\gamma+\delta+\epsilon=100$, wherein $\epsilon$ is the total atomic percent of the nitrogen and/or oxygen atom. Namely, it is desirable that the recording layer comprise a nitride and/or oxide comprising at least one of the constituent elements Ag, In, Te and Sb, or a nitrogen atom. Such a nitride and/or oxide, or a nitrogen atom may constitute the boundaries of crystals in the recording layer or the interfaces between the recording layer and first and second protective layers to be described later.

For obtaining excellent disc characteristics of the optical recording medium, it is preferable that the respective atomic percent of $\alpha$, $\beta$, $\gamma$, and $\delta$ of the constituent elements Ag, In, Te and Sb for use in the previously mentioned sputtering target for fabricating the recording layer be in the relationship of $2\leq\alpha\leq27$, $5\leq\beta\leq28$, $13\leq\gamma\leq45$, $20\leq\delta\leq75$, and $\alpha+\beta+\gamma+\delta=100$, more preferably $2\leq\alpha\leq25$, $8\leq\beta\leq25$, $15\leq\gamma\leq40$, $25\leq\delta\leq65$, and $\alpha+\beta+\gamma+\delta100$. In view of the materials for use in the layers constituting the recording medium other than the recording layer, for example, a protective layer and a reflective layer, and the thickness of those layers, the most appropriate composition of the target for fabricating the recording layer may be determined so as to obtain a desired linear speed of the recording medium and a desired mark length.

As previously mentioned, it is preferable that the compound or mixture for use in the sputtering target of the present invention comprise Sb and $AgInTe_2$ with a stoichiometric composition and/or a nearly stoichiometric composition having a chalcopyrite structure. When the recording layer is deposited in a thin film by sputtering by use of the above-mentioned target, there can be obtained a mixed phase in the recording layer, namely, a crystalline phase comprising $AgSbTe_2$ and an In—Sb amorphous phase, by subjecting the recording layer to proper heat treatment for initialization. Because of such a mixed phase in the recording layer, there can be obtained an optical recording medium capable of showing high erasability and repeatedly carrying out the recording operation and the erasing operation by the low power application.

The particle size of crystallites of $AgInTe_2$ with a stoichiometric composition and/or a nearly stoichiometric composition having a chalcopyrite structure for use in the sputtering target can be calculated, for instance, from the width of a main peak which is obtained from the X-ray diffraction of the pulverized target. For instance, when Cu is employed for the source of X-ray and $\lambda$ is about 1.54 Å, the width of the main peak is about 24.1°. It is necessary that the width of the peak be corrected with reference to the main peak of a reference sample with a sufficiently large particle size. In the case where the particle size of crystallites of $AgInTe_2$ in the sputtering target is 450 Å or less, it is possible to obtain the previously mentioned mixed-phase recording layer which is capable of performing stable recording and erasing operations as long an the recording layer is subjected to appropriate heat treatment after the fabrication of the recording layer.

When the recording layer of an optical recording medium is fabricated by sputtering by use of the previously mentioned target of the present invention, it is desirable that the back pressure (p) applied prior to the sputtering process be set in the range of $3\times10^{-7}\leq(p)\leq5\times10^{-6}$ Torr. When the back pressure (p) is set so as to satisfy the relationship of $3\times10^{-7}\leq(p)\leq5\times10^{-6}$ Torr, the amorphous phase comprising a mixture of $AgInTe_2$ and Sb can be readily turned into the mixed-phase of the crystalline phase of $AgSbTe_2$ and the In—Sb amorphous phase in the recording layer by some heat treatment.

In addition, when the recording layer of the optical recording medium according to the present invention is formed by sputtering by use of the previously mentioned sputtering target, it in preferable that argon gas be mixed, with nitrogen gas at a concentration of 0 to 15 mol % in a sputter chamber. Depending on the amount of nitrogen in the gas, the composition of the obtained recording layer can be adjusted. Thus, the recording layer can be fitted to a predetermined linear speed of the recording medium, the desired structure of layers of the recording medium, and the desired operating conditions of the recording medium. By use of a mixed gas of nitrogen gas and argon gas in the course of sputtering, the recording and erasing repetition reliability of the recording medium according to the present invention is improved. The mixed gas previously obtained by mixing nitrogen gas and argon gas at a predetermined mixing ratio may be introduced into the sputter chamber, or the games are introduced into the sputter chamber with the respective flow rates of the nitrogen gas and the argon gas being controlled so as to obtain a desired molar ratio.

Further, it is advantageous that a gas containing nitrogen gas with a concentration higher than the concentration of nitrogen in the gas employed during the sputtering process be introduced into the sputter chamber after sputtering process.

As the electromagnetic waves for use in the present invention, which are used for initializing the fabricated recording layer, and carrying out the recording, reproducing and erasing operations, there can be employed laser beams, electron rays, X-rays, ultraviolet rays, visible rays, infrared rays, and microwave. In particular, the semiconductor laser beam is most applicable as the electromagnetic wave for use in the recording, reproducing and erasing operations because a system for driving the optical recording medium can be made compact.

It is preferable that the thickness of the recording layer produced by the method of the present invention by use of the above-mentioned sputtering target be in the range of 80 to 5,000 Å, more preferably in the range of 150 to 1,000 Å. When the thickness of the recording layer is in the range of 80 to 5,000 Å, sufficient light absorbing power of the recording layer can be maintained, and the phase change can uniformly and speedily take place in the recording layer.

The optical recording medium comprising an Ag—In—Sb—Te based recording material according to the present invention is superior to the conventional recording media with respect to (1) the shelf stability and (2) the overwriting repetition reliability.

By using four kinds of optical recording media No. I to No. IV as shown in Table 1, the deterioration behaviors of the optical recording media according to the present invention were examined to evaluate the shelf stability from the following aspects:

(1) Archival life: the shelf life of a recorded signal when stored at 80° C. and 85% RH, with respect to the readability thereafter.
(2) Shelf properties: the shelf life of a non-recorded portion, that is, an initialized portion when stored at 80° C. and 85% RH, with respect to the recordability thereafter.
(3) Overwriting shelf properties: the shelf life of a signal-recorded portion when stored at 80° C. and 85% RH, with respect to the overwriting capability thereafter.

To be more specific, the evaluation was carried out in such a manner that the linear speed of each optical recording medium was set at 1.2 m/sec., and the overwriting frequency was Bet at 0.72 MHz/0.20 MHz.

invention, each comprising an Ag—In—Sb—Te based recording material.

As is apparent from the graph shown in FIG. 1(c), the overwriting shelf properties of the recording medium No. III deteriorate when stored at 80° C. and 85% RH for 200 hours. This deterioration will be referred to as an initial deterioration. Further, with respect to the archival life of the recording media shown in FIG. 1(a), the recording medium No. I deteriorated when stored at 80° C. and 85% RH for about 1,000 hours. This deterioration will be referred to as a middle-phase deterioration. In particular, the initial deterioration of the overwriting shelf properties is considered to be the most important problem to be solved.

It has been confirmed by the analysis that the initial deterioration of the overwriting shelf properties results from the phenomenon that some portions cannot be completely made amorphous in the recording layer when the recording medium is stored under the circumstances of high temperature of 80° C. and high humidity of 85% RH.

In addition, it has also been confirmed that the deteriorating rate of the initial deterioration with respect to the overwriting shelf properties depends on the composition of the recording layer of the recording medium. As shown in FIG. 2, when the atomic percent α of Ag and γ of Te in the composition of the recording layer are in the relationship of $\alpha - \gamma/2 \leq -8$, the initial deterioration rate with respect to the overwriting shelf properties can be efficiently decreased. The initial deterioration rate is expressed by an increment in jitter of a recording signal per hour of the storage time. With respect to the initial deterioration of the overwriting shelf properties, there is no striking dependence on the thickness of the recording layer, the material for use in the second protective layer, and the material for use in the reflective heat dissipation layer.

The repetition reliability of the Ag—In—Sb—Te based phase-change type optical recording medium will now be explained in detail.

The repetition properties of the above-mentioned optical recording medium were examined by observing the condition of the recording layer by use of a transmission-type

TABLE 1

| Recording Medium No. | Substrate | First Protective Layer (Thickness) | Recording Layer (*) (Thickness) | Second Protective Layer (Thickness) | Reflective Layer (Thickness) (***) | Mark in FIGS. 1 & 2 |
|---|---|---|---|---|---|---|
| No. I | PC (**) | $ZnS.SiO_2$ (200 nm) | $Ag_8In_{15}Sb_{43}Te_{34}$ (35 nm) | AlN (30 nm) | Ag (70 nm) | ○ |
| No. II | PC (**) | $ZnS.SiO_2$ (200 nm) | $Ag_8In_{11}Sb_{49}Te_{32}$ (30 nm) | $ZnS.SiO_2$ (20 nm) | Al alloy (100 nm) | Δ |
| No. III | PC (**) | $ZnS.SiO_2$ (200 nm) | $Ag_{11}In_{14}Sb_{43}Te_{32}$ (30 nm) | $ZnS.SiO_2$ (20 nm) | Al alloy (100 nm) | □ |
| No. IV | PC (**) | $ZnS.SiO_2$ (200 nm) | $Ag_{11}In_{14}Sb_{43}Te_{32}$ (20 nm) | $ZnS.SiO_2$ (20 nm) | Al alloy (100 nm) | ■ |

(*) The composition of each recording layer was analyzed by the induced coupled plasma (ICP) analysis.
(**) PC denotes polycarbonate.
(***) On the reflective layer, ultra-violet-curing resin was coated with a thickness of 4 μm in any of the recording media.

The shelf deterioration behaviors of the above optical recording media comprising the Ag—In—Sb—Te based phase-change recording material are shown in FIGS. 1(a) to 1(c).

FIGS. 1(a), 1(b) and 1(c) are graphs which respectively show the archival life, the shelf properties, and the overwriting shelf properties of the phase-change type optical recording media Nos. I, II and III according to the present electron microscope, and conducting the electron diffraction after the overwriting operations were repeatedly carried out. As a result, generation of voids and segregation of the composition of the recording layer were recognized.

The generation of voids and the segregation of the composition of the recording layer are inseparable phenomena. A portion from which a constituent element of the recording layer is moved is recognized as a void, and the movement of the elements causes the segregation of the recording layer. In other words, the deterioration of the overwriting repetition properties is caused by the movement of the constituent elements of the recording layer. According to the report of C. Herring, J. Appl. Phys., 21,437 (1950), it is considered that the movement of the constituent elements of the recording layer is driven by a tensile stress gradient generated in the recording layer.

The movement of the constituent elements of the recording layer will now be explained by referring to FIGS. 3(a) and 3(b).

In an optical recording medium as shown in FIGS. 3(a) and 3(b), a first protective layer 13, a recording layer 15, a second protective layer 17 are successively overlaid on a substrate 11.

In FIG. 3(b), a portion of the recording layer 15 is fused by the application of a laser beam 21 for recording information therein. At this time, the tensile stress is practically lost at the fused portion, while the tensile stress (S) of about +200 MPa is applied to an unfused portion, so that a large tensile stress gradient is generated in the recording layer 15. The elements 19 constituting the recording layer 15 are therefore driven to move in the directions of arrows at the fused portion, as shown in FIG. 3(b). In FIG. 3(a), the laser beam for the recording operation is not applied to the recording medium, so that the tensile stress (S) of about +200 MPa is uniformly applied to the recording layer 15, and no tensile stress gradient is generated in the recording layer 15.

The tensile stress generated in the recording layer 15 is determined by the total sum of the thermal stress and the true stress, in particular, the compression stress, of the first protective layer 13 and the second protective layer 17. Therefore, the tensile stress gradient in the recording layer 15 can be decreased by reducing the thermal stress and the compression stress of the first protective layer 13 and the second protective layer 17.

Figure 4:
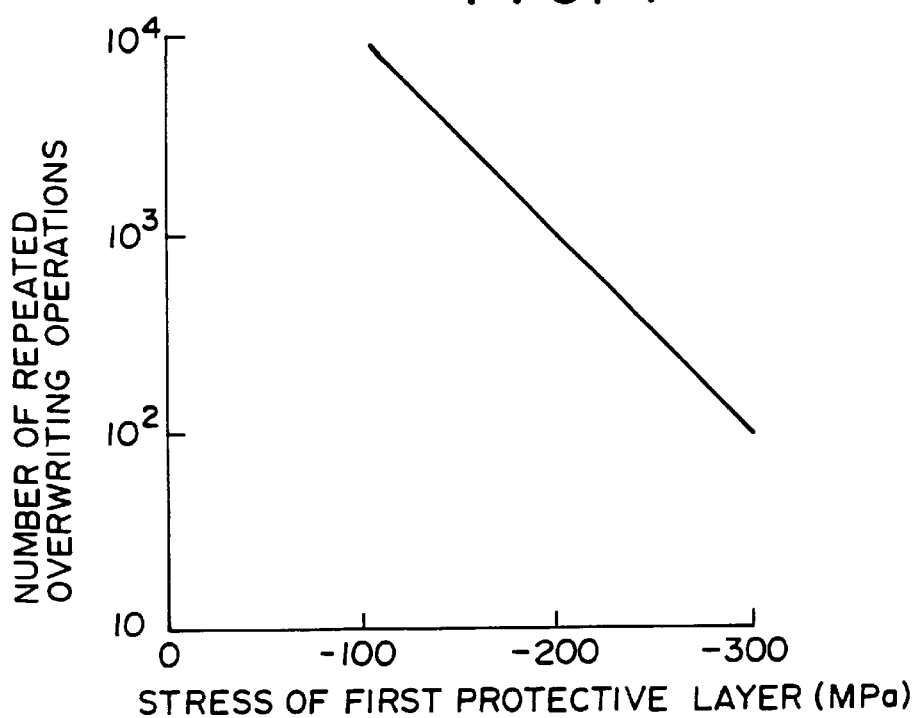
FIG. 4 is a graph in explanation of the relationship between the stress of a protective layer of the optical recording medium according to the present invention, and the number of times in which the overwriting operations can be repeated.

FIG. 4 is a graph which shows the relationship between the number of the repeated overwriting operations and the sum of the thermal stress and the true stress of the first protective layer of the optical recording medium. As can be seen from the graph shown in FIG. 4, it is preferable that the total of the thermal stress and the true stress of the protective layer be −150 MPa or more to carry out the overwriting operations 2,000 times or more, and that the total of those stresses of the protective layer be −100 MPa or more to carry out the overwriting operations 10,000 times or more.

When the tensile stress generated in the recording layer exceeds the yield stress thereof, voids are generated in the recording layer and the recording layer is cut off. Therefore, it is necessary that the yield stress of the recording layer be larger than the tensile stress generated in the recording layer.

Figure 5:
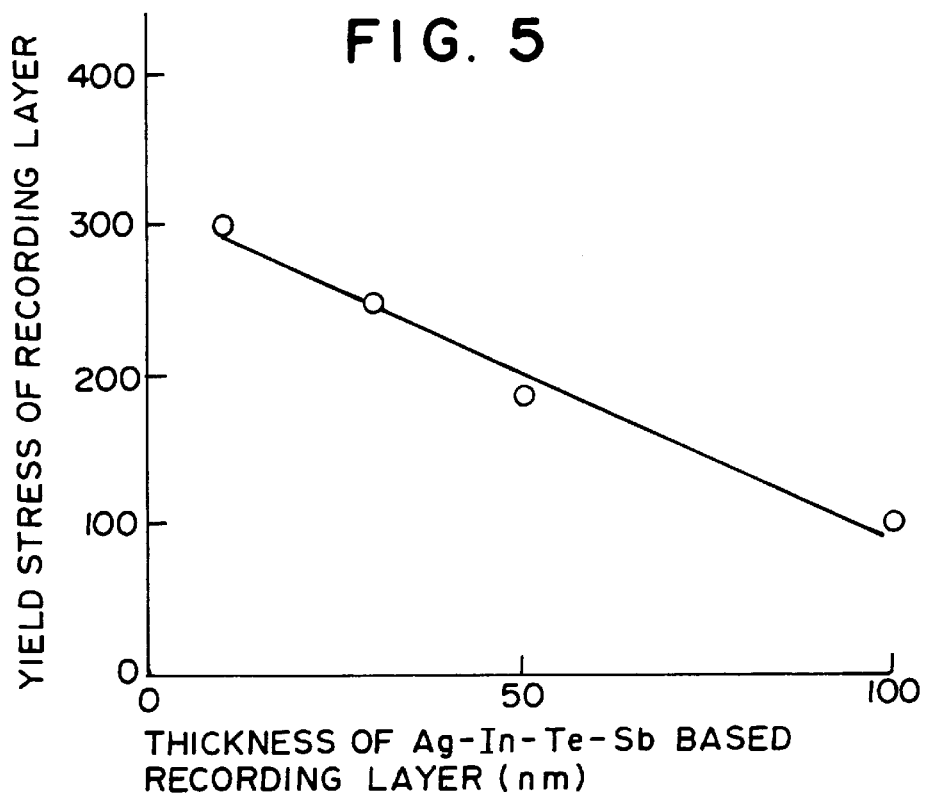
FIG. 5 is a graph in explanation of the relationship between the thickness of a recording layer comprising an Ag—In—Te—Sb based recording material and the yield stress of the recording layer.

FIG. 5 is a graph which shows the relationship between the thickness of the Ag—In—Te—Sb based recording layer and the yield stress thereof. The tensile stress generated in the Ag—In—Te—Sb based recording layer is in the range of 150 to 250 MPa, so that it is preferable that the yield stress of the recording layer be 200 MPa or more, more preferably 250 MPa or more. To obtain such a yield stress of the Ag—In—Te—Sb based recording layer, the thickness of the Ag—In—Te—Sb based recording layer for use in the present invention may be adjusted to 50 nm or less, preferably 30 nm or less as can be seen from the graph shown in FIG. 5.

The generation of voids in the recording layer during the repeated overwriting operations is increased in the case where the materials for the first protective layer is different from that for the second protective layer. If the materials for the first and second protective layers are different, the wettabilities of the first and second protective layers by the recording material become different when the recording material is fused by the application of the laser beam in the overwriting operation. As a result, the fused recording material in the recording layer moves to the interface between the recording layer and the one protective layer with better wettability, consequently, thereby generating the voids on the interface between the recording layer and another protective layer with poorer wettability. The generation of the voids result in the deterioration of the overwriting repetition properties of the recording medium. Therefore, the overwriting repetition properties of the optical recording medium according to the present invention can be improved by employing the same material for the first and second protective layers.

When the thermal conductivity of the first protective layer is different from that of the second protective layer, there is generated a thermal stress distribution. This is also the cause of the movement of the recording material in the recording layer. From the viewpoint of thermal conductivity, it is desirable to employ the same material for the first and second protective layers.

All described in Japanese Laid-Open Patent Application 4-78031, a mixed-phase structure composed of an $AgSbTe_2$ phase and an In—Sb phase is formed in an Ag—In—Sb—Te based recording material. When optical recording is performed, phase changes of the $AgSbTe_2$ take place between the crystalline state and the amorphous state. In this case, the particle size of the crystallites of $AgSbTe_2$ is about 10 nm. In such a mixed phase structure, the amount of constituent elements of the recording material which move in the recording layer is dominant at the interface of the mixed phases, and increases as the tensile stress gradient generated in the recording layer increases.

The movement of the constituent elements of the recording material in the recording layer can also be prevented by capturing those elements in the course of movement. To be more specific, a carbon atom, a nitrogen atom and an oxygen atom, which are respectively tetravalent, trivalent and bivalent, can capture the constituent elements of the recording material moving in the recording layer. Furthermore, the addition of elements such as Al, Ga, Se, Ge, Pd and Pb to the recording layer is effective because they can form an alloy or compound in combination with any of the constituent elements Ag, In, Te and Sb.

As previously explained, to ensure high shelf stability of the optical recording medium according to the present invention, it is preferable that the respective atomic percent of $\alpha$, $\beta$, $\gamma$, and $\delta$ of the constituent elements Ag, In, Te and Sb for use in the recording layer be in the relationship of $0<\alpha\leq30$, $0<\beta\leq30$, $10\leq\gamma\leq50$, $10\leq\delta\leq80$, $\alpha-\gamma/2\leq-8$, and $\alpha+\beta+\gamma+\delta=100$.

As previously mentioned, the recording layer of the optical recording medium according to the present invention may further comprise an element such as C, N, O, Al, Ga, Se, Ge, Pd or Pb. For the addition of the elements C, N and O to the recording layer, $CH_4$, $N_2$, $NH_3$, $NO_2$, find $N_2O$ can be used.

In the present invention, glass, ceramics and resins are usable as the materials for the substrate of the optical recording medium. In particular, the resin substrate in advantageous from the viewpoints of moldability and manufacturing cost. Examples of the resin for use in the substrate of the recording medium include polycarbonate resin, epoxy resin, polystyrene resin, acrylonitrile—styrene copolymer resin, polyethylene resin, and polymethyl methacrylate resin. Of these resins, the polycarbonate resin is most preferable in terms of the processability and the optical properties. The substrate may be prepared in the form of a disc, card or sheet. The thickness of the substrate may be arbitrarily selected from 1.2 mm, 0.6 mm, 0.3 mm and so on. A thinner substrate is desired because the occurrence of cross talk phenomenon depends on the tilt of the substrate. However, when the difficulty in the formation of the layers overlaid on the substrate and the yield of the recording medium are taken into consideration, the most preferable thickness of the substrate is 0.6 mm.

The first and second protective layers for use in the present invention can be provided by sputtering, ion plating, vacuum deposition or plasma CVD method.

Specific examples of the material for use in the first and second protective layers include oxides such as SiO, $SiO_2$, ZnO, $SnO_2$, $Al_2O_3$, $TiO_2$, $In_2O_3$, MgO, and $ZrO_2$; nitrides such as $Si_3N_4$, AlN, TiN, BN and ZrN; sulfides such as ZnS, $In_2S_3$ and $TaS_4$; carbides such as SiC, $TaC_4$, $B_4C$, WC, TiC and ZrC; carbon with a diamond structure; and mixtures thereof.

It is preferable that the thickness of the first protective layer be in the range of 50 to 500 nm, more preferably in the range of 100 to 300 nm, and further preferably in the range of 120 to 250 nm. It is preferable that the thickness of the second protective layer be in the range of 5 to 300 nm, more preferably in the range of 10 to 50 nm.

When the first and second protective layers are provided by sputtering, the stress of both protective layers can be controlled by the pressure and electric power in the course of sputtering process and the distance between the substrate and the target for fabricating each protective layer. In general, the stress of the obtained protective layers can be reduced when they are formed by sputtering under such conditions that the pressure is increased, the plasma electric power is decreased, and the distance between the substrate and the target is increased. In addition, the stress of the protective layers can be reduced by using a composite material for each protective layer.

The reflective heat dissipation layer is not always necessary, but the provision of this layer is desirable because the thermal energy excessively accumulated during the recording and/or erasing operations can be dissipated by the reflective heat dissipation layer, thereby reducing the thermal damage applied to the recording medium itself.

Examples of the material for the reflective heat dissipation layer include metals such as Al, Ag and Au. Furthermore, elements such as Ti, Cr and Si may be added to he above-mentioned materials. The reflective heat dissipation layer can be provided by sputtering, ion-plating, vacuum deposition or plasma CVD method.

Other features of this invention will become apparent in the course of the following description of exemplary embodiments, which are given for illustration of the invention and are not intended to be limiting thereof.

EXAMPLES 1 TO 16 AND COMPARATIVE EXAMPLES 1 TO 8

A 200 nm thick first protective layer of $ZnS.SiO_2$ was provided on a polycarbonate substrate with a thickness of 1.2 mm with guide grooves having a width of about 0.6 $\mu$m and it depth of about 600 Å. on the first protective layer, a recording layer with a thickness of 25 nm was formed by sputtering by use of a target as shown in Table 2. Further, a 30 nm thick second protective layer of $ZnS.SiO_2$, a reflective heat dissipation layer comprising an aluminum alloy with a thickness of 100 nm, and an ultraviolet-curing resin layer with a thickness of 5 $\mu$m were successively overlaid on the recording layer.

Table 2 shows the comnposition of a sputtering target for fabricating each recording layer, which comprises Sb and a compound of $AgInTe_2$ with a stoichiometric composition and/or a nearly stoichiometric composition having a chalcopyrite structure; and the composition of the obtained recording layer.

The recording layer was formed on the first protective layer by sputtering under such conditions that the back pressure applied prior to the sputtering process was set at $9 \times 10^{-7}$ Torr, and then adjusted to $4 \times 10^{-3}$ Torr during the sputtering process by introducing argon gas into the sputter chamber, and the $RF_{power}$ was set at 40 W.

Thus, disc-shaped optical recording media Nos. 1 to 16 according to the prevent invention and comparative disc-shaped optical recording media Nos. 1 to 8 were fabricated.

Using each of the above-mentioned optical recording media Nos. 1 to 16 according to the present invention and comparative optical recording media Nos. 1 to 8 the recording properties were evaluated by recording a mark with a length of about 1 $\mu$m, and the erasing properties were then evaluated by overwriting the above-mentioned mark by a mark with a length of about 3 $\mu$m. Those evaluations were carried out in such a manner that each recording medium was rotated at such a linear speed as to obtain a maximum C/N ratio, a semiconductor laser beam with a wavelength of 780 nm was employed for recording and overwriting operations, and the objective lens with a numerical aperture (NA) of 0.5 was used.

As a result of the above-mentioned evaluations, the disc characteristics of each recording medium were assessed in accordance with the following scale:

Level 3: Excellent disc characteristics.

C/N≧55 dB, and erasability (Ers)≦-35 dB.

Level 2: Good disc characteristics.

55>C/N≦45 dB, and -35<(Ers)≦-25 dB.

Level 1: Poor disc characteristics.

C/N<45 dB, and (Ers)>-25 dB.

The results of the disc characteristics are also shown in the Table 2.

TABLE 2

| | Composition of Sputtering Target | | | | Composition of Recording Layer | | | | |
|---|---|---|---|---|---|---|---|---|---|
| | Ag (at. %) | In (at. %) | Te (at. %) | Sb (at. %) | Ag (at. %) | In (at. %) | Te (at. %) | Sb (at. %) | Level of Disc Characteristics |
| Ex. 1 | 4.0 | 15.0 | 25.0 | 56.0 | 2.0 | 13.0 | 24.0 | 61.0 | 3 |
| Ex. 2 | 6.0 | 8.0 | 10.0 | 76.0 | 4.0 | 5.0 | 11.0 | 80.0 | 2 |
| Ex. 3 | 7.0 | 11.0 | 22.0 | 60.0 | 5.5 | 9.0 | 21.0 | 64.5 | 3 |

TABLE 2-continued

| | Composition of Sputtering Target | | | | Composition of Recording Layer | | | | Level of Disc Characteristics |
|---|---|---|---|---|---|---|---|---|---|
| | Ag (at. %) | In (at. %) | Te (at. %) | Sb (at. %) | Ag (at. %) | In (at. %) | Te (at. %) | Sb (at. %) | |
| Ex. 4 | 8.0 | 27.0 | 20.0 | 45.0 | 5.0 | 29.0 | 16.0 | 50.0 | 2 |
| Ex. 5 | 10.0 | 15.0 | 28.0 | 47.0 | 7.0 | 13.0 | 26.0 | 54.0 | 3 |
| Ex. 6 | 11.0 | 11.0 | 22.0 | 56.0 | 8.0 | 9.0 | 21.0 | 62.0 | 3 |
| Ex. 7 | 12.5 | 12.0 | 44.0 | 31.5 | 9.0 | 13.0 | 46.0 | 32.0 | 2 |
| Ex. 8 | 12.5 | 12.5 | 25.0 | 50.0 | 9.0 | 10.0 | 24.0 | 57.0 | 3 |
| Ex. 9 | 12.5 | 15.0 | 37.5 | 35.0 | 9.0 | 13.0 | 25.0 | 53.0 | 3 |
| Ex. 10 | 12.5 | 15.0 | 40.0 | 32.5 | 9.0 | 13.0 | 37.0 | 41.0 | 3 |
| Ex. 11 | 13.0 | 15.0 | 35.0 | 37.0 | 10.0 | 13.0 | 32.0 | 45.0 | 3 |
| Ex. 12 | 15.0 | 15.0 | 30.0 | 40.0 | 12.0 | 13.0 | 28.0 | 47.0 | 3 |
| Ex. 13 | 19.0 | 22.0 | 39.0 | 21.0 | 13.0 | 25.0 | 42.0 | 20.0 | 2 |
| Ex. 14 | 20.0 | 5.0 | 23.0 | 52.0 | 20.0 | 2.0 | 21.0 | 57.0 | 2 |
| Ex. 15 | 22.0 | 21.0 | 14.0 | 43.0 | 25.0 | 19.0 | 15.0 | 41.0 | 2 |
| Ex. 16 | 27.0 | 23.0 | 30.0 | 20.0 | 28.0 | 26.0 | 34.0 | 12.0 | 2 |
| Comp. Ex. 1 | 1.0 | 10.0 | 15.0 | 74.0 | 0.5 | 4.0 | 13.0 | 82.5 | 1 |
| Comp. Ex. 2 | 2.0 | 3.0 | 10.0 | 85.0 | 0.1 | 4.0 | 8.0 | 87.9 | 1 |
| Comp. Ex. 3 | 8.0 | 20.0 | 55.0 | 17.0 | 11.0 | 17.0 | 63.0 | 9.0 | 1 |
| Comp. Ex. 4 | 10.0 | 1.0 | 40.0 | 49.0 | 7.0 | 0.1 | 37.0 | 55.9 | 1 |
| Comp. Ex. 5 | 12.0 | 40.0 | 30.0 | 18.0 | 6.0 | 43.0 | 26.0 | 25.0 | 1 |
| Comp. Ex. 6 | 15.0 | 6.0 | 5.0 | 74.0 | 13.0 | 5.0 | 4.0 | 78.0 | 1 |
| Comp. Ex. 7 | 27.0 | 23.0 | 40.0 | 10.0 | 20.0 | 31.0 | 45.0 | 4.0 | 1 |
| Comp. Ex. 8 | 34.0 | 8.0 | 40.0 | 18.0 | 32.0 | 5.0 | 35.0 | 28.0 | 1 |

As can be seen from the results shown in Table 2, the disc characteristics of the optical recording medium are satisfactory when the sputtering target for fabricating the recording layer comprises as constituent elements Ag, In, Te and Sb, with the respective atomic percent being in the relationship of $2 \leq \alpha \leq 30$, $3 \leq \beta \leq 30$, $10 \leq \gamma \leq 50$, $15 \leq \delta \leq 83$, and $\alpha + \beta + \gamma + \delta = 100$.

EXAMPLES 17 AND 18 AND COMPARATIVE EXAMPLE 9

The procedure for fabricating the disc-shaped optical recording medium No. 3 in example 3 was repeated except that nitrogen gas was added to the argon gas at a concentration of 6.0, 15.0 and 20.0 mol % in the sputter chamber, respectively in Example 17, Example 18 and Comparative Example 9, when the recording layer was formed on the first protective layer by sputtering.

Thus, disc-shaped optical recording media Nos. 17 and 18 according to the present invention, and a comparative disc-shaped optical recording medium No. 9 were fabricated.

Table 3 shows the composition of each of the thus obtained recording layer in terms of the atomic percent of each element.

Under appropriate recording conditions, each of the optical recording media Nos, 3, 17 and 18 according to the present invention and the comparative optical recording medium No. 9 was repeatedly subjected to the overwriting operation. In the overwriting operation the recording and overwriting frequencies were adjusted so that a mark with a length of about 1 μm, and a mark with a length of about 3 μm were alternately overwritten. Then, the maximum number of the repeated overwriting operations was obtained.

The results are also shown in Table 3.

TABLE 3

| Example No. | $N_2/(Ar + N_2)$ [mol %] | Composition of Recording Layer (atom. %) | | | | | Maximum Number of Repeated Overwriting Operations |
|---|---|---|---|---|---|---|---|
| | | Ag | In | Te | Sb | N | |
| Ex. 3 | 0 | 5.5 | 9.0 | 21.0 | 64.5 | 0 | 200,000 |
| Ex. 17 | 6.0 | 5.4 | 8.8 | 20.6 | 63.2 | 2.0 | 800,000 |
| Ex. 18 | 15.0 | 5.1 | 8.6 | 20.0 | 61.3 | 5.0 | 600,000 |
| Comp. Ex. 9 | 20.0 | 5.1 | 8.4 | 19.5 | 60.0 | 7.0 | 10,000 |

As is apparent from the results shown in Table 3, the overwriting repetition properties of the optical recording medium according to the present invention are satisfactory when the concentration of the nitrogen gas is 15 mol % or less in the sputter chamber in the course of the formation of the recording layer by sputtering.

EXAMPLE 19

The sputtering target for fabricating the recording layer used in Example 5 was produced by fusing the constituent elements to prepare a fused mixture, rapidly cooling the fused mixture to prepare a solid lump, pulverizing the solid lump to prepare finely-divided particles, and sintering the finely-divided particles.

The procedure for preparation of the disc-shaped optical recording medium No. 5 in Example 5 was repeated except that the method of producing the target for fabricating the recording layer of the recording medium No. 5 in Example 5 was modified in such a manner that the heat treatment step was added prior to the mintering step. Thus, a disc-shaped optical recording medium No. 5a according to the present invention was obtained.

The overwriting characteristics of the optical recording medium No. 5a were compared with those of the optical recording medium No. 5 by carrying out the overwriting operation at a linear speed of the recording medium of 5 m/sec.

Figure 6:
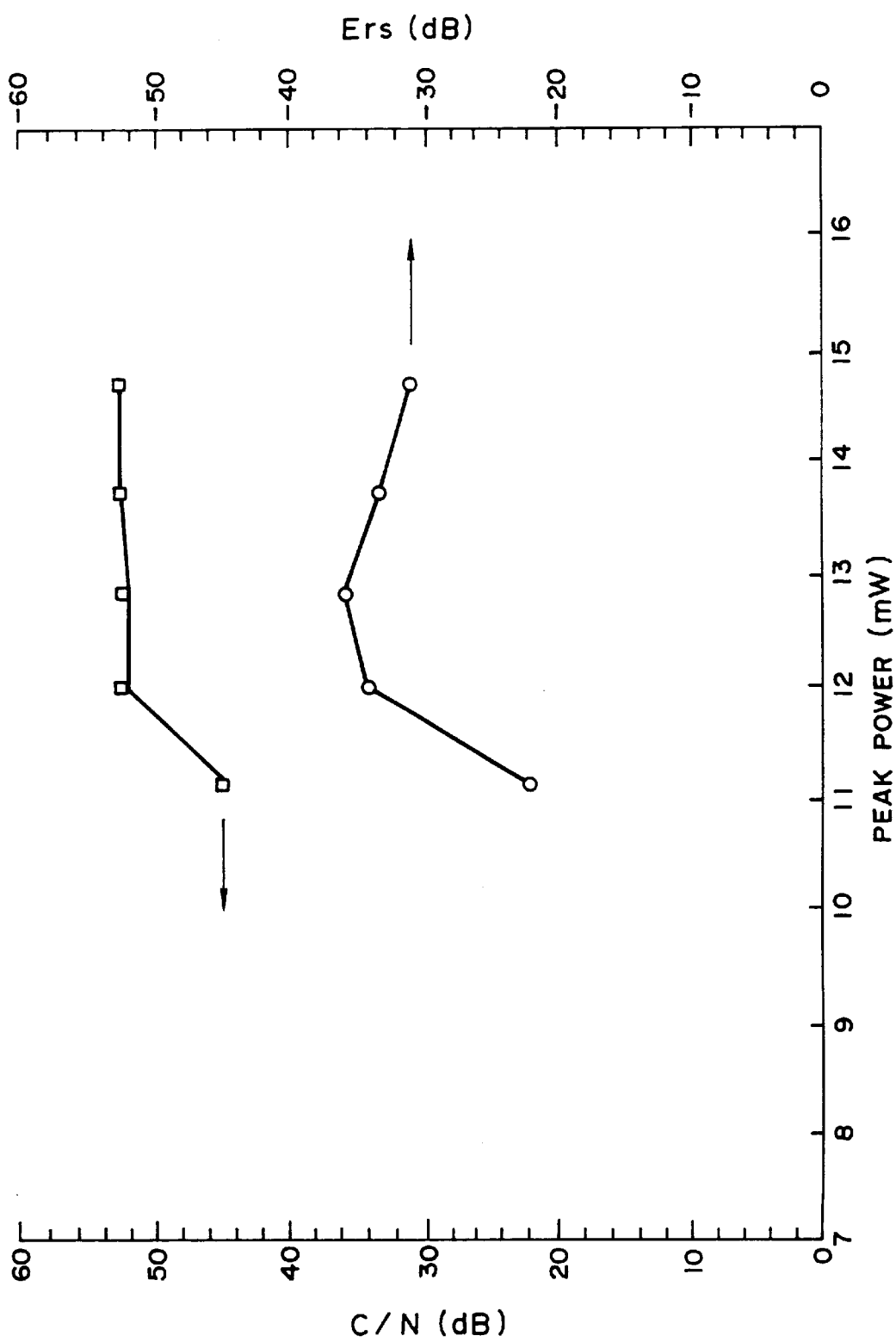
FIG. 6 is a graph which shows the disc characteristics of a recording layer of an optical recording medium according to the present invention, which recording layer is fabricated from a sputtering target produced by the method including the heat treatment step.

FIG. 6 is a graph which shows the overwriting characteristics of the optical recording medium No. 5a, the recording layer of which was fabricated by using the target produced by the method including the heat treatment step before the sintering step.

Figure 7:
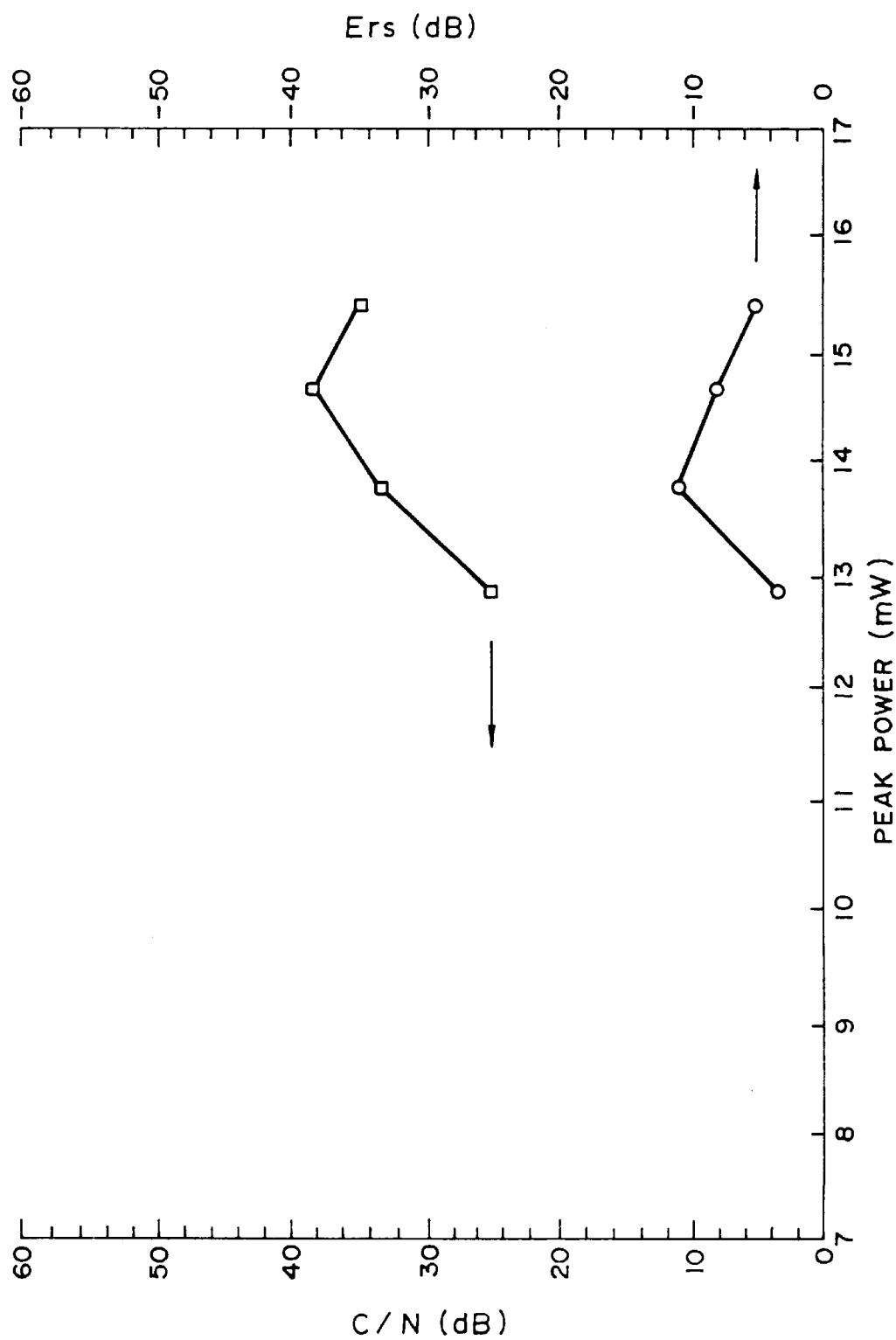
FIG. 7 is a graph which shows the disc characteristics of a recording layer of an optical recording medium according to the present invention, which recording layer is fabricated from a sputtering target produced by the method not including the heat treatment step.

In contrast to this, FIG. 7 is a graph which shows the overwriting characteristics of the optical recording medium No. 5, the recording layer of which was fabricated by using the target produced by the method not including the heat treatment step before the sintering step.

As a result, the optical recording medium No. 5a is superior to the recording medium No. 5 with respect to the disc characteristics such as the C/N ratio and the erasability, and the overwriting sensitivity.

EXAMPLE 20

It was confirmed that each of the sputtering targets employed in Examples 1 to 16 for fabricating the recording layer comprises $AgInTe_2$ forming crystallites with a particle size of 450 Å or less.

The procedure for preparation of the disc-shaped optical recording medium No. 9 in Example 9 was repeated except that the target for fabricating the recording layer of the recording medium No. 9 in Example 9 was replaced by a target with the same composition as that of the target employed in Example 9, with the particle size of crystallites of AgInTe2 being controlled to 500 Å. Thus, a disc-shaped optical recording medium No. 9a according to the present invention was obtained.

The overwriting characteristics of the optical recording medium No. 9a were compared with those of the optical recording medium No. 9 by carrying out the overwriting operation at a linear speed of the recording medium of 2 m/sec.

Figure 8:
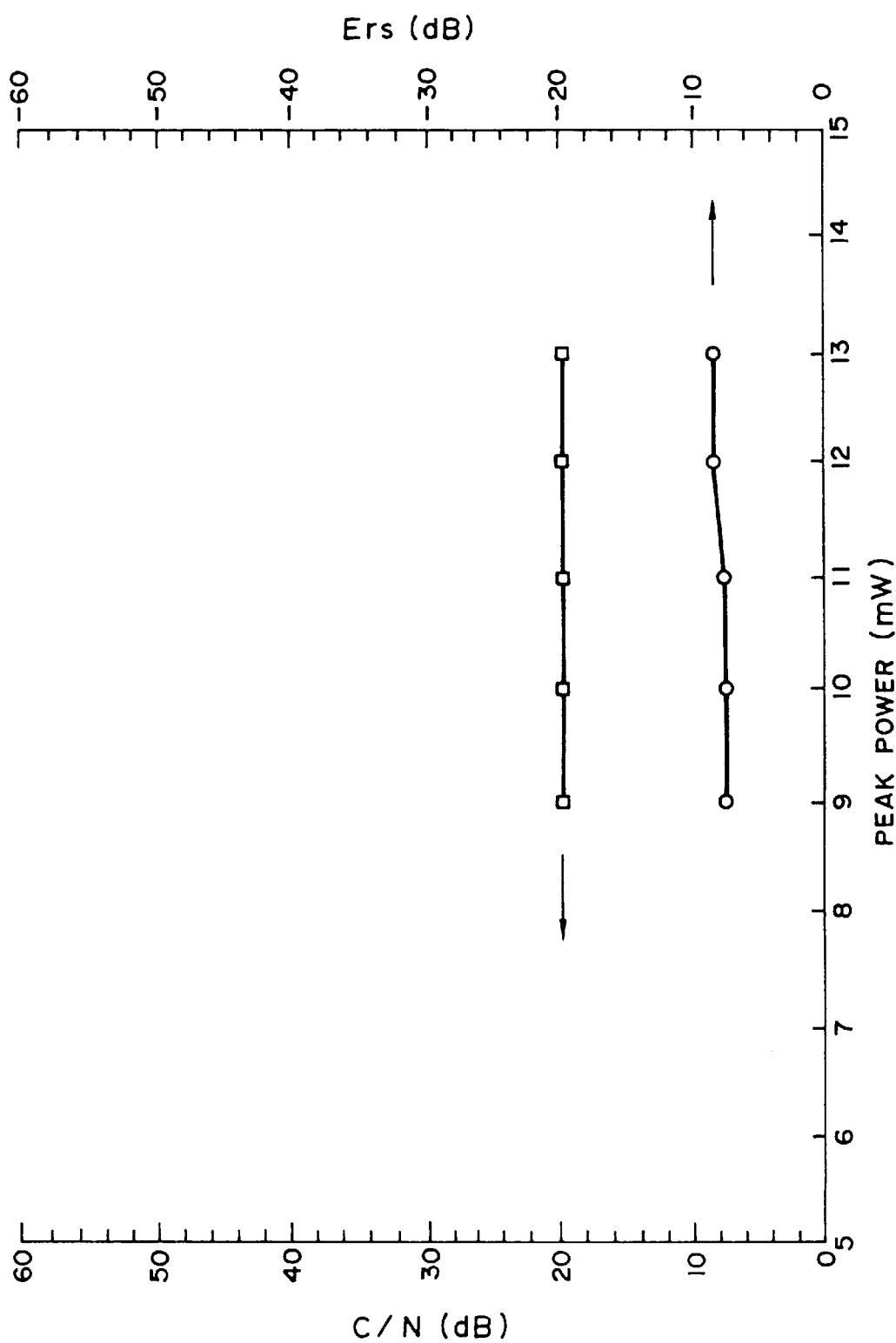
FIG. 8 is a graph which shows the overwriting characteristics of an optical recording medium according to the present invention, whose recording layer is fabricated from a sputtering target comprising $AgInTe_2$ which forms crystallites with a particle size of 500 Å.

FIG. 8 is a graph which shows the overwriting characteristics of the optical recording medium No. 9a.

As a result, the optical recording medium No. 9 is superior to the recording medium No. 9a with respect to the disc characteristics such as the C/N ratio and the erasability, and the overwriting sensitivity.

EXAMPLE 21

The constituent elements of Ag, In, Te and Sb for use in a target with the same composition as that of the target used in Example 5 were fused at a temperature of 600° C. or more, and the fused mixture was rapidly cooled and pulverized. Thereafter, the obtained finely-divided particles were sintered. Thus, a sputtering target according to the present invention was obtained for fabricating a recording layer of the optical recording medium.

The procedure for preparation of the above-mentioned target was repeated except that a mixture of the constituent elements was fused at 590° C., so that a comparative target was fabricated.

Using the above-mentioned two kinds of targets, disc-shaped optical recording media Nos. 5b and 5c were fabricated in the same manner as in Example 5.

The thus obtained disc-shaped optical recording media Nos. 5b and 5c were compared with each other. As a result, the recording and erasing characteristics of the optical recording medium No. 5b were better than those of the optical recording medium No. 5c.

EXAMPLE 22

On a polycarbonate substrate with a thickness of 1.2 mm, a first protective layer of $ZnS.SiO_2$ with a thickness of 200 nm, a recording layer with the composition of $Ag_6In_{11}Sb47Te_{34}$ with a thickness of 20 nm, a second protective layer of $ZnS.SiO_2$ with a thickness of 20 nm, and a reflective heat dissipation layer with a thickness of 100 nm comprising an Al alloy were successively provided by sputtering process, and an ultraviolet-curing resin layer with a thickness of 4 µm was further provided on the reflective heat dissipation layer by spin coating method.

In the formation of the first and second protective layer, the reaction pressure was set at 0.008 Torr and the plasma power was set at 1.0 kW so as to control the stress of each protective layer to −130 MPa.

In addition, the composition of the recording layer was adjusted so as to satisfy the relationship of $\alpha-\gamma/2=-9$. The yield stress of the recording layer was 270 Mpa.

Thus, a disc-shaped phase-change type optical recording medium No. 22 according to the present invention was fabricated.

Then, the shelf stability and the overwriting repetition reliability of the recording medium No. 22 were examined. To be more specific, the evaluations of the archival life, the shelf properties, and the overwriting shelf properties of the recording medium No. 22 wore carried out in such a manner that the optical recording medium No. 22 was rotated at a linear speed of 1.2 m/sec after storage at 80° C. and 85%RH, and the overwriting frequency was set at 0.72 MHz/0.20 MHz.

The shelf life of the recording medium No. 22 with respect to each of the above-mentioned evaluation items is expressed by a maximum period of storage time after which recording can be carried out without the jitter 1σ exceeding 35 ns.

The overwriting repetition reliability of the optical recording medium No. 22 is expressed by the maximum number of the repeated overwriting operations in which the jitter 1σ did not exceed 35 ns.

As a result, the shelf life of the recording medium No. 2.2 was 2,000 hours or more with respect to the archival life, the shelf properties and the overwriting shelf properties. The overwriting repetition reliability was about 5,000 times.

EXAMPLE 23

On a polycarbonate substrate with a thickness of 1.2 mm, a first protective layer of $ZnS.SiO_2$ with a thickness of 200 nm, a recording layer with a thickness of 20 nm, comprising $Ag_8In_{11}Sb_{47}Te_{34}$ and N, a second protective layer of ZnS- .SiO$_2$ with a thickness of 20 nm, and a reflective heat dissipation layer with a thickness of 100 nm comprising an Al alloy were successively provided by sputtering process, and an ultraviolet-curing resin layer with a thickness of 4 μm was further provided on the reflective heat dissipation layer by spin coating method.

In the formation of the first and second protective layers, the reaction pressure was set at 0.008 Torr and the plasma power was set at 1.0 kw so as to control the stress of each protective layer to −130 MPa.

In the formation of the recording layer, the sputtering was carried out in a gas comprising argon gas and nitrogen gas with a concentration of 3 mol %. In addition, the composition of the recording layer was adjusted so as to satisfy the relationship of $\alpha-\gamma/2=-9$. The yield stress of the recording layer was 270 MPa.

Thus, a disc-shaped phase-change type optical recording medium No. 23 according to the present invention was fabricated.

Then, the archival life, the shelf properties, the overwriting shelf properties, and the overwriting repetition reliability of the recording medium No. 23 were evaluated in the same manner as in Example 22.

As a result, the shelf life of the recording medium No. 23 was 2,000 hours or more with respect to the archival life, the shelf properties and the overwriting shelf properties. The overwriting repetition reliability was about 7,000 times. With the addition of nitrogen to the composition of the recording layer, the overwriting repetition reliability of the obtained optical recording medium according to the present invention was improved.

EXAMPLE 24

On a polycarbonate substrate with a thickness of 1.2 mm, a first protective layer of ZnS.SiO$_2$ with a thickness of 200 nm, a recording layer with a thickness of 20 nm, comprising Ag$_8$In$_{11}$Sb47Te$_{34}$ and Pd, a second protective layer of ZnS.SiO$_2$ with a thickness of 20 nm, and a reflective heat dissipation layer with a thickness of 100 nm comprising an Al alloy were successively provided by sputtering process, and an ultraviolet-curing resin layer with a thickness of 4 μm was further provided on the reflective heat dissipation layer by-spin coating method.

In the formation of the first and second protective layers, the reaction pressure was set at 0.008 Torr and the plasma power war set at 1.0 kW so as to control the stress of each protective layer to −130 MPa.

In the formation of the recording layer, Pd was added in an amount of 0.3 wt. % to the composition of the sputtering target for fabricating the recording layer. In addition, the composition of the recording layer was adjusted so as to satisfy the relationship of $\alpha-\gamma/2=-9$. The yield stress of the recording layer was 270 MPa.

Thus, a disc-shaped phase-change type optical recording medium No. 24 according to the present invention was fabricated.

Then, the archival life, the shelf properties, the overwriting shelf properties, and the overwriting repetition reliability of the recording medium No. 24 were evaluated in the same manner as in Example 22.

As a result, the shelf life of the recording medium No. 24 was 2,000 hours or more with respect to the archival life, the shelf properties and the overwriting shelf properties. The overwriting repetition reliability was about 7,000 times. With the addition of Pd to the composition of the recording layer, the overwriting repetition reliability of the obtained optical recording medium according to the present invention was improved.

EXAMPLE 25

On a polycarbonate substrate with a thickness of 1.2 mm, a, first protective layer of ZnS.SiO$_2$ with a thickness of 200 nm, a recording layer with a thickness of 17 nm comprising Ag$_8$In$_{11}$Sb$_{47}$Te34, a second protective layer of ZnS.SiO$_2$ with a thickness of 20 nm, and a reflective heat dissipation layer with a thickness of 100 nm comprising an Al alloy were successively provided by sputtering process, and an ultraviolet-curing resin layer with a thickness of 4 μm was further provided on the reflective heat dissipation layer by spin coating method.

In the formation of the first and second protective layers, the reaction pressure was set at 0.008 Torr and the plasma power was set at 1.0 kW so as to control the stress of each protective layer to −130 MPa.

In addition, the composition of the recording layer was adjusted so as to satisfy the relationship of $\alpha-\gamma/2=-9$. The yield stress of the recording layer was 290 MPa.

Thus, a disc-shaped phase-change type optical recording medium No. 25 according to the present invention was fabricated.

Then, the archival life, the shelf properties, the overwriting shelf properties, and the overwriting repetition reliability of the recording medium No. 25 were evaluated in the same manner as in Example 22.

As a result , the shelf life of the recording medium No. 25 was 2,000 hours or more with respect to the archival life, the shelf properties and the overwriting shelf properties. The overwriting repetition reliability was about 8,000 times.

EXAMPLE 26

On a polycarbonate substrate with a thickness of 1.2 mm, a first protective layer of ZnS.SiO$_2$ with a thickness of 200 nm, a recording layer with a thickness of 17 nm comprising Ag$_8$In$_{11}$Sb$_{47}$Te$_{34}$, a second protective layer of ZnS.SiO$_2$ with a thickness of 20 nm, and a reflective heat dissipation layer with a thickness of 100 nm comprising an Al alloy were sucessively provided by sputtering process, and an ultraviolet-curing resin layer with a thickness of 4 μm was further provided on the reflective heat dissipation layer by spin coating method.

In the formation of the first and second protective layers, the reaction pressure was set at 0.008 Torr and the plasma power was get at 0.8 kw so as to control the stress of each protective layer to −100 MPa.

In addition, the composition of the recording layer was adjusted so as to satisfy the relationship of $\alpha-\gamma/2=-9$. The yield stress of the recording layer was 290 MPa.

Thus, a disc-shaped phase-change type optical recording medium No. 26 according to the present invention was fabricated.

Then, the archival life, the shelf properties, the overwriting shelf properties, and the overwriting repetition reliability of the recording medium No, 26 were evaluated in the same manner as in Example 22.

As a result, the shelf life of the recording medium No. 26 was 2,000 hours or more with respect to the archival life, the shelf properties and the overwriting shelf properties. The overwriting repetition reliability was about 10,000 times.

EXAMPLE 27

The procedure for preparation of the disc-shaped optical recording medium No. 3 in Example 3 was repeated except that the back pressure applied prior to the sputtering process for forming the recording layer in Example 3 was variously changed. Thus, disc-shaped optical recording media according to the present invention were obtained.

Figure 9:
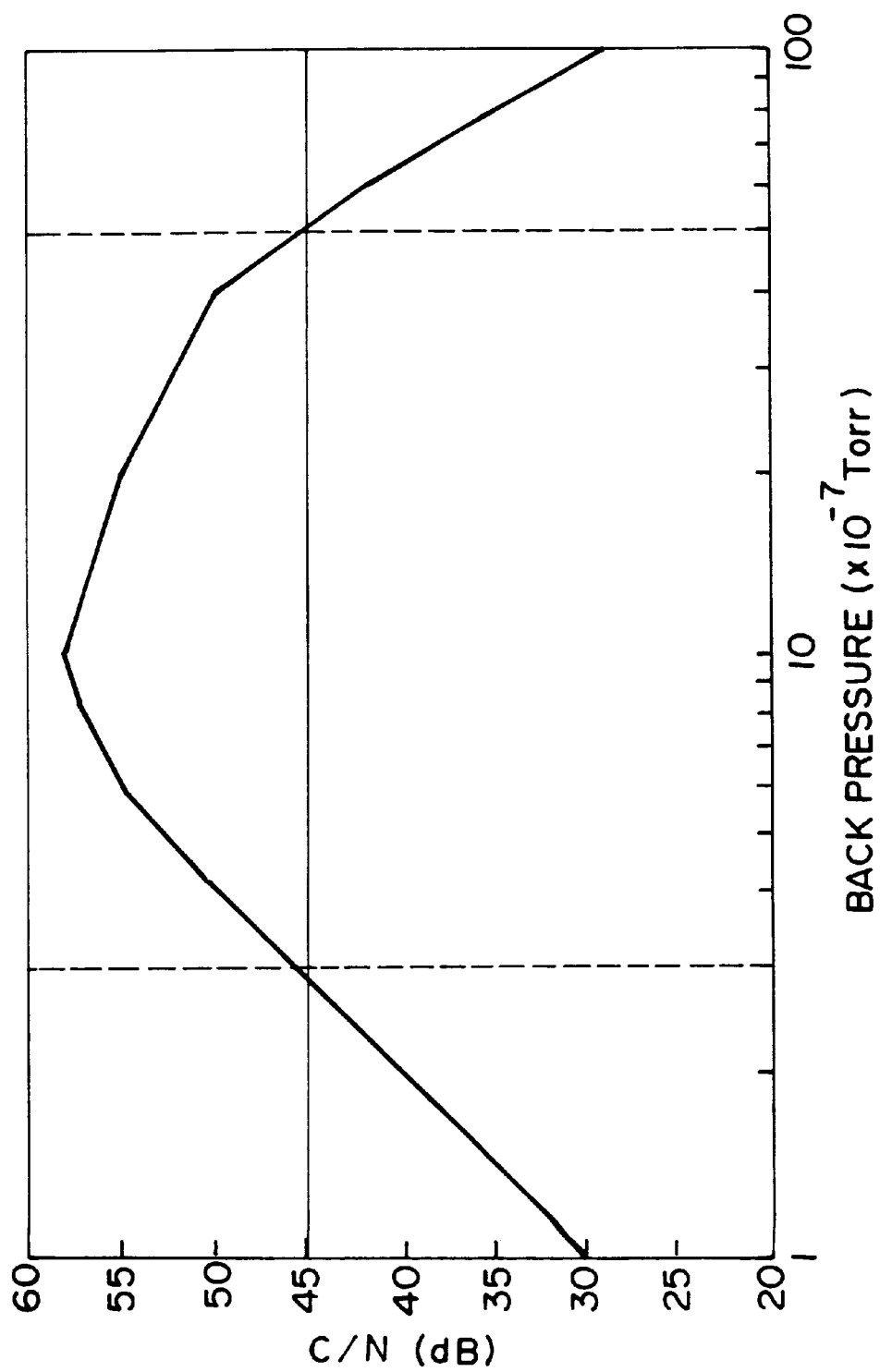
FIG. 9 is a graph in explanation of the relationship between the back pressure applied prior to the sputtering process and the C/N ratio of a recording layer of the obtained optical recording medium according to the present invention.

FIG. 9 is a graph which shows the relationship between the bask pressure and the C/N ratio of the obtained recording medium.

As is apparent from the graph shown in FIG. 9, preferable C/N ratio can be obtained when the back pressure was in the range of $3\times10^{-7}$ to $5\times10^{-8}$ Torr.

As previously explained, the optical recording medium according to the present invention is excellent with respect to the C/N ratio, erasability, sensitivities, jitter, shelf stability, repetition reliability. In particular, the shelf stability and the repetition reliability are drastically improved.

What is claimed is:

1. An optical recording medium comprising a recording layer capable of recording and erasing information by utilizing changes in the phase of a recording material in said recording layer, said recording layer comprising as constituent elements Ag, In, Te and Sb with the respective atomic percent of $\alpha$, $\beta$, $\gamma$ and $\delta$ thereof being in the relationship of:

$0<\alpha\leq30$, $0<\beta\leq30$, $10\leq\gamma\leq50$, $10\leq\delta\leq80$, and $\alpha+\beta+\gamma+\delta=100$, wherein $\alpha$ and $\gamma$ in said atomic percent of $\alpha$, $\beta$, $\gamma$ and $\delta$ in said recording layer are in the relationship of $\alpha-\gamma/2\leq-8$.

2. The optical recording medium as claimed in claim 1, wherein said recording layer comprises a nitride and/or oxide comprising at least one of said constituent elements Ag, In, Te and Sb; or a nitrogen atom.

3. The optical recording medium as claimed in claim 1, wherein said recording layer further comprises an element which is capable of forming an alloy or compound in combination with any of said constituent elements Ag, In, Te and Sb.

4. An optical recording medium comprising a recording layer capable of recording and erasing information by utilizing changes in the phase of a recording material in said recording layer, said recording layer comprising as constituent elements Ag, In, Te, Sb, and nitrogen and/or oxygen atom with the respective atomic percent of $\alpha$, $\beta$, $\gamma$, $\delta$ and $\epsilon$ thereof being in the relationship of:

$0<\alpha\leq30$, $0<\beta\leq30$, $9\leq\gamma\leq50$, $9\leq\delta\leq80$, $0<\epsilon\leq5$, and $\alpha+\beta+\gamma+\delta+\epsilon=100$, wherein $\epsilon$ is the total atomic percent of said nitrogen and/or oxygen atom, and wherein $\alpha$ and $\gamma$ in said atomic percent of $\alpha$, $\beta$, $\gamma$, $\delta$ and $\epsilon$ in said recording layer are in the relationship of $\alpha-\gamma/2\leq-8$.

5. The optical recording medium as claimed in claim 4, wherein said recording layer comprises a nitride and/or oxide comprising at least one of said constituent elements Ag, In, Te and Sb; or a nitrogen atom.

6. The optical recording medium as claimed in claim 4, wherein said recording layer further comprises an element which is capable of forming an alloy of compound in combination with any of said constituent elements Ag, In, Te and Sb.

7. An optical recording medium comprising:

a polycarbonate substrate, a first protective layer, a recording layer, a second protective layer, a reflective heat dissipation layer and an ultraviolet curing resin layer, which are overlaid in this order, said recording layer comprising as constituent elements Ag, In, Te and Sb with the respective atomic percent of $\alpha$, $\beta$, $\gamma$ and $\delta$ thereof being in the relationship of:

$0<\alpha\leq30$, $0<\beta\leq30$, $10\leq\gamma\leq50$, $10\leq\delta\leq80$, and $\alpha+\beta+\gamma+\delta=100$.

8. The optical recording medium as claimed in claim 7, wherein $\alpha$ and $\gamma$ in said atomic percent of $\alpha$, $\beta$, $\gamma$ and $\delta$ in said recording layer are in the relationship of $\alpha-\gamma/2\leq-8$.

9. The optical recording medium as claimed in claim 7, wherein the total of the thermal stress and true stress of each of said first protective layer and said second protective layer in at least 150 MPa.

10. The optical recording medium as claimed in claim 7, wherein said recording layer has a yield stress of at least 200 MPa.

11. An optical recording medium comprising:

a polycarbonate substrate, a first protective layer, a recording layer, a second protective layer, a reflective heat dissipation layer and an ultraviolet curing resin layer, which are overlaid in this order, said recording layer comprising as constituent elements Ag, In, Te, Sb, and nitrogen and/or oxygen atom with the respective atomic percent of $\alpha$, $\beta$, $\gamma$, $\delta$ and $\epsilon$ thereof being in the relationship of:

$0<\alpha\leq30$, $0<\beta\leq30$, $9\leq\gamma\leq50$, $9\leq\delta\leq80$, $0<\epsilon\leq5$, and $\alpha+\beta+\gamma+\delta+\epsilon=100$, wherein $\epsilon$ is the total atomic percent of said nitrogen and/or oxygen atom.

12. The optical recording medium as claimed in claim 11, wherein $\alpha$ and $\gamma$ in said atomic percent of $\alpha$, $\beta$, $\gamma$, $\delta$ and $\epsilon$ in said recording layer are in the relationship of $\alpha-\gamma/2\leq-8$.

13. The optical recording medium as claimed in claim 11, wherein the total of the thermal stress and true stress of each of said first protective layer and said second protective layer in at least 150 MPa.

14. The optical recording medium as claimed in claim 11, wherein said recording layer has a yield stress of at least 200 MPa.

15. An optical recording medium comprising a recording layer capable of recording and erasing information by utilizing changes in the phase of a recording material in said recording layer, said recording layer comprising as constituent elements Ag, In, Te and Sb with the respective atomic percent of $\alpha$, $\beta$, $\gamma$ and $\delta$ thereof being in the relationship of:

$0<\alpha\leq30$, $0<\beta\leq30$, $10\leq\gamma\leq50$, $10\leq\delta\leq80$, and $\alpha+\beta+\gamma+\delta=100$, wherein said recording layer further comprises an element which is capable of forming an alloy or compound in combination with any of said constituent elements Ag, In, Te and Sb.

16. An optical recording medium comprising a recording layer capable of recording and erasing information by utilizing changes in the phase of a recording material in said recording layer, said recording layer comprising as constituent elements Ag, In, Te, Sb, and nitrogen and/or oxygen atom with the respective atomic percent of $\alpha$, $\beta$, $\gamma$, $\delta$ and $\epsilon$ thereof being in the relationship of:

$0 < \alpha \leq 30$,
$0 \leq \beta \leq 30$
$9 \leq \gamma \leq 50$,
$9 \leq \delta \leq 80$,
$0 < \epsilon \leq 5$, and $\alpha + \beta + \gamma + \delta + \epsilon = 100$, wherein $\epsilon$ is the total atomic percent of said nitrogen and/or oxygen atom, and wherein said recording layer further comprises an element which is capable of forming an alloy or compound in combination with any of said constituent elements Ag, In, Te and Sb.

* * * * *